United States Patent [19]

Chasek

[11] Patent Number: 5,519,622
[45] Date of Patent: May 21, 1996

[54] REAL TIME, ECONOMIC-IMPACT DISPLAY SYSTEM FOR CONSUMERS OF COMMODITIZED ELECTRIC POWER

[76] Inventor: Norman E. Chasek, 24 Briar Brae Rd., Stamford, Conn. 06903

[21] Appl. No.: 137,420

[22] Filed: Oct. 18, 1993

[51] Int. Cl.$^6$ .......................... G06F 17/00; G01R 11/56
[52] U.S. Cl. ...................... 364/464.04; 324/116; 340/500
[58] Field of Search .................. 324/116; 340/870.02, 340/500; 364/464.04, 483

[56] References Cited

U.S. PATENT DOCUMENTS

| | | | |
|---|---|---|---|
| 3,683,343 | 8/1972 | Feldman et al. | 364/483 X |
| 4,390,876 | 6/1983 | Bjorklund et al. | 340/825.17 |
| 4,549,274 | 10/1985 | Lerner et al. | 364/492 |
| 4,731,547 | 3/1988 | Alenduff et al. | 364/494 X |
| 4,803,632 | 2/1989 | Frew et al. | 364/483 X |
| 5,237,507 | 8/1993 | Chasek | 324/116 X |
| 5,278,772 | 1/1994 | Knupp | 364/492 |

Primary Examiner—Edward R. Cosimano

[57] ABSTRACT

This invention describes a method for presenting, in near real-time, information that guides consumers of variably priced electricity in the cost efficient management of its consumption. The method employs a single row of red and green lights whose illumination pattern simultaneously indicates price differences from a mean price of the electricity, the size of a surcharge during high demand time, the size of a bonus stake per KWH available to those consumers with little or no increase in demand during such times, and individual bonus-surcharge eligibility during high demand times. The use of electricity can be quickly prioritized by typical consumers through the number of red and green of lights lit, steady and blinking lights, and by a variable duty cycle imposed on blinking lights. When taken together the overall economics of consumption can be communicated in a manner that facilitates complicated trade-offs in the cost efficient use of electricity.

4 Claims, 3 Drawing Sheets

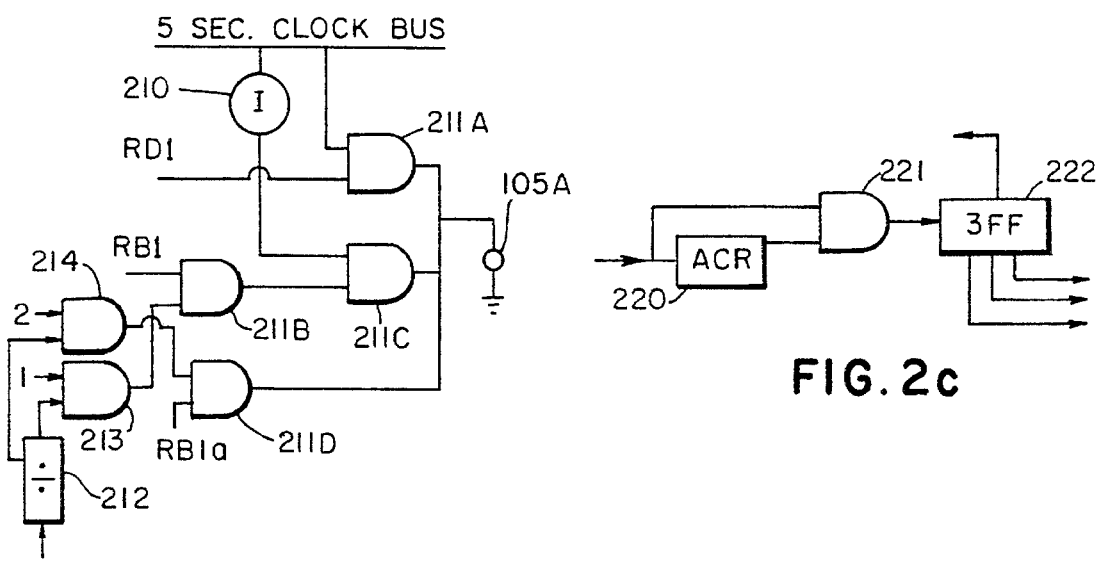
FIG. 2b
FIG. 2c
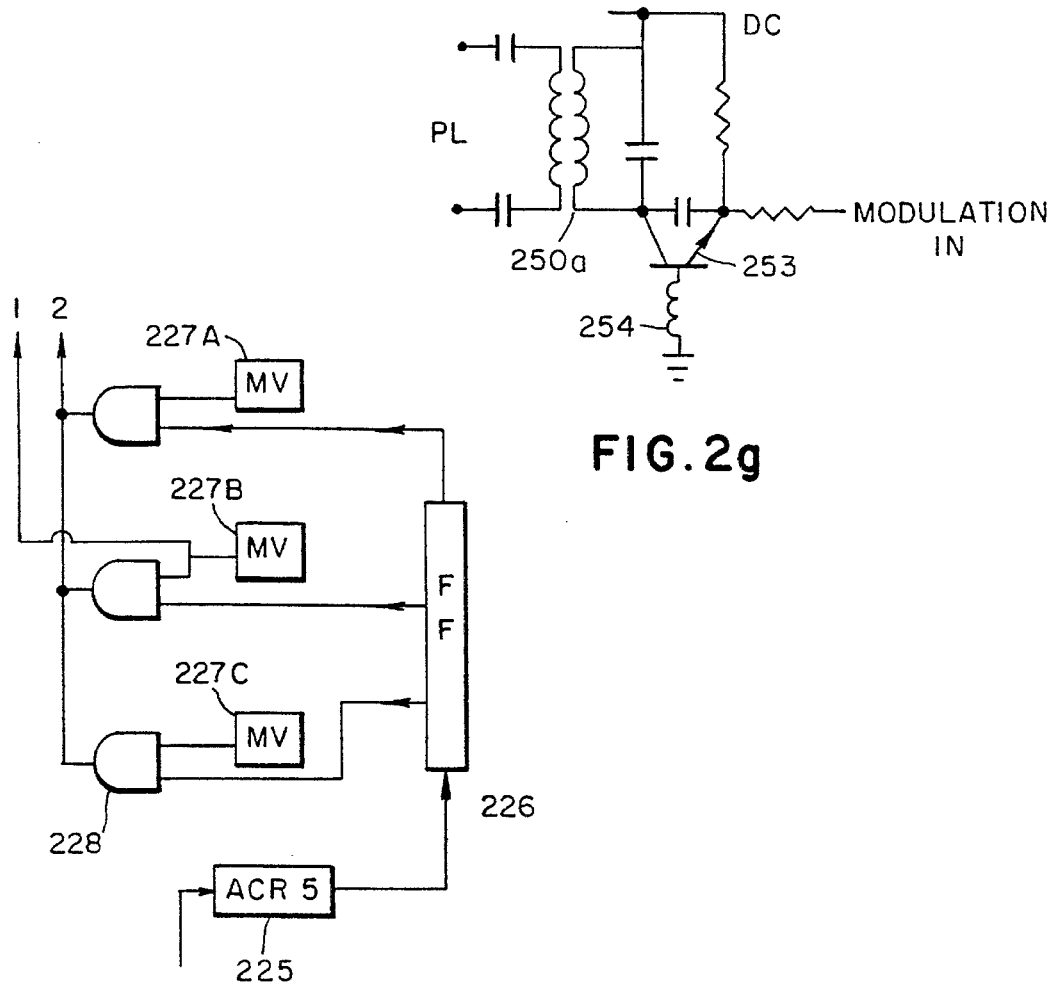
FIG. 2g
FIG. 2d

REAL TIME, ECONOMIC-IMPACT DISPLAY SYSTEM FOR CONSUMERS OF COMMODITIZED ELECTRIC POWER

BACKGROUND OF THE INVENTION

If a product as mercurial as electric energy is to be commoditized, which means here that its momentary price is determined by supply and demand and competitive market conditions, it would be desireable to provide each consumer with a low cost, near real-time grasp of the economic impact of using electricity.

A near real-time economic impact indicator for commoditized electricity is described in U.S. Pat. No. 5,237,507. It consists of a utility central computer developing an index number ranging from 0 to 9 to represent current demand-related-price, or DRP, and a second 0 to 9 number estimating bonus/surcharge, or B-S, index that is being allotted during high demand periods to reflect the economic impact of using electricity when the power system is approaching its capacity limits. The B-S distribution, if efficiently communicated to consumers, will more aggressively influence demand during such times than would be otherwise possible. The B-S method overcomes the relative demand-price inelasticity during high demand periods by imposing large, net revenue neutral, penalties and rewards based on the marginal demand response of each consumer during out-of-doors temperature extremes and then communicating the estimated level of the reward or penalty pool in real-time.

In the preferred B-S allocation process, a surcharge pool is created that is inversely proportional to the difference between actual demand and system capacity. The bonus pool is then set equal to that surcharge pool. The number of recipients that share in the bonus pool is estimated by the extent to which demand is being constrained from normal during high demand periods. The number of bonus recipients divided into the bonus pool equals the bonus stake.

This B-S display needs to generate an estimate of the real-time surcharge pool size per KWH and the potential bonus stake/KWH. This is done by correlating past billing quantities with demand in relation to generation capacity and out-of-doors temperature. The ideal display should also provide information on individual B-S eligibility. These three parameters are compositely presented in a manner that is easily grasped by the typical consumer.

The above referenced patent describes the dual numerical display as being latched-on for specified intervals by a momentarily broadcast radio signal. The numerical display however does not provide a quick grasp to the typical consumer of his or her real time energy economics impact, nor does it provide specific guidance to each consumer for appropriate demand adjustment during high demand periods.

SUMMARY OF THE INVENTION

This invention describes a method and apparatus that presents, in near real-time, the economic impact of market priced electricity so that this information can be intuitively grasped by lay consumers, helping them manage demand for electricity in a manner that minimizes electric bills and incidentally reduces capital expenditures for utilities.

The presentation needs a low cost, display providing economic information to the consumer, on his premises, that helps prioritize demand during normal and peak periods. For normal periods that information is comprised of estimates of real time, demand-related pricing expressed as deviations from a mean price. For peak periods it is comprised of normalized levels of the surcharge/KWH, the potential consumer bonus stake/KWH, and individual consumer B-S eligibility. A utility computer would determine these quantities, with the exception of individual eligibility, from post facto consumption information that is correlated with real-time demand, out-of-doors temperature, etc. The bonus or surcharge eligibility is determined from information derived from a calendar-time watt-hour meter on the consumer's premises.

The total B-S factor is determined from, 1) the size of the surcharge pool, which is related to total system demand compared to system capacity, and 2) the available bonus/KWH, which is based on actual demand for a given out-of-doors temperature, and 3) the extent of individual B-S eligibility, which is based on differences from an assigned-max demand level established for each consumer and the amount by which each individual's actual demand varies from that assigned-max level during high demand periods. If the individual consumer's demand exceeds or falls below the assigned max level, the sign of the deviation indicates the individual consumer's eligibility for either a surcharge or bonus. The normalized difference provides additional guidance on demand adjustment to realize economic benefit.

The display is preferably mounted on a clock face or any other frequently viewed surface, and is comprised of a row of red and green points of light that are actuated by associated circuit means which translates momentary bursts of information, received from a utility central computer, into light patterns that communicate 1) positive (red) or negative (green) price deviations from a mean level to help prioritize demand adjustments, and 2) B-S assignments that prioritize demand adjustments to avoid heavy surcharges and/or become eligible for large bonuses. The full B-S display compositely indicates first the size of the surcharge pool and the bonus stake, and then individual consumer eligibility for either bonus or surcharge.

Each consumer÷s potential bonus stake/KWH depends on how many consumers are actually participating in the bonus pool at any time. This quantity can be approximated by correlating total current demand and out-of-doors temperature with a past bonus data analysis. The bonus stake/KWH quantity is the surcharge pool divided by the estimated number of bonus recipients. Three quantities are time shared in the display. These are 1) demand price, 2) surcharge/KWH and potential bonus stake/KWH, and 3) individual B-S eligibility. In a preferred display the number and color of steady lights indicate the relative demand related price that is in effect at any time, with red lights indicating an above mean level price and green below mean level price. The number of blinking red and green lights, with the red and green on simultaneously indicate the relative size of the surcharge/KWH pool(red) and the potential bonus stake/KWH (green). The duty cycle of a blinking red (without simultaneous green) indicates the demand adjustment needed to move from surcharge assessment to bonus award. Green on alone indicates demand level makes that consumer eligible for bonus, with duty cycle of the blink indicating extent of the eligibility.

The intuitive consumer response to this display is that when green is on alone it is economically advantageous to use more electricity and when red is on alone, it is advantageous to restrict demand. When red and green are simultaneously on and blinking, the information being presented is helpful in prioritizing demand adjustment for potential B-S allocations.

It is probable that at first not everyone would get or want an individualized bonus-surcharge eligibility display because of its cost. The display would then indicate only the relative size of the surcharge/KWH by the number of blinking reds and the relative size of the bonus stake/KWH by the number of simultaneously on blinking greens, and not indicate the consumer's eligibility to either.

This display method can induce demand instability if the same information were simultaneously presented to all consumers. The broadcast transmissions could be separately disseminated in time slots to different customer groupings to avoid demand oscillation or overshoot. Each customer's display processor would therefore contain a address code receiver ACR, that only responds to messages addressed to that consumer category. The various aspects and advantages of this invention will be more fully understood from a consideration of the following detailed description in conjunction with the accompanying drawings.

BRIEF DESCRIPTION OF THE DRAWINGS

FIGS. 2b illustrates one of six logic stages that controls lighting of one of the six lights.

FIG. 2c illustrates the addressed memory element.

FIG. 2d illustrates the B-S processer in block diagram form, including calendar-time KWH meter configuration.

FIG. 2g is an illustrative power line carrier transmitter.

DETAILED DESCRIPTION OF A PREFERRED EMBODIMENT OF THE INVENTION

Figure 1:
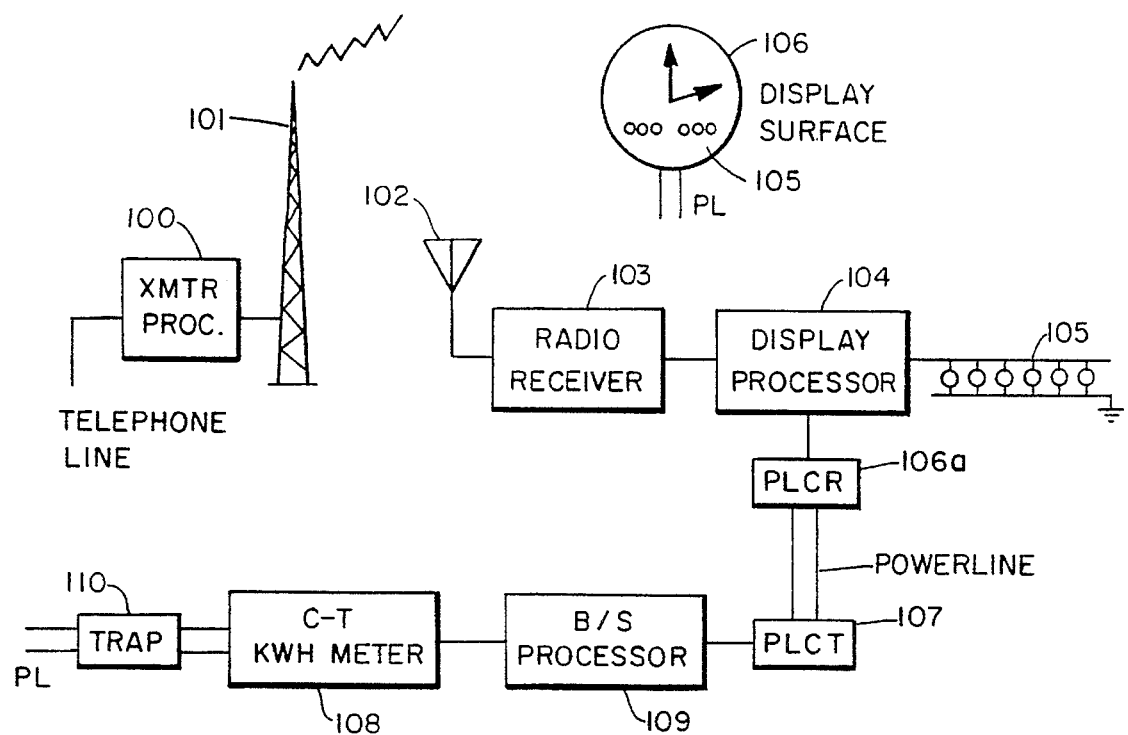
FIG. 1 illustrates a fully implemented economic impact indicator/display system in block diagram form.

FIG. 1 illustrates one approach to the economic impact display system. This system includes a radio broadcast transmitter which incorporates pre-emption processor, 100, which stores and inserts display triggering information, received by phone line from a utility center computer and includes means for feeding that data into the transmitter modulator while momentarily diverting other signals. This triggering information is transmitted through antenna 101 to all consumers within range.

The actual display is mounted on surface 106, which in this case is a clockface. The display consists of a row of green and red points of light, 105. Beneath surface 106 is mounted ferrite loop receiving antenna, 102, miniature fixed tuned radio receiver 103, display processor 104, and powerline carrier receiver 106a. For those consumers who want B-S eligibility information, bonus-surcharge processor 109, and powerline carrier transmitter, 107, are mounted within calendar-time watt-hour meter, 108. RF trap 110 inserted in the power line blocks RF signals from leaking back to other consumer power lines.

Transmitter processor, 100, receives the display-pattern-triggering information in the form of several digital bytes from the utility's control center. These bytes are transmitted in a brief burst, ie. 0.1 seconds in duration, once every 15 or 30 minutes. The broadcasted signal is received by radio receiver 103 and the byte information is temporarily stored in display processor 104, which converts the byte information into actuation logic needed to realize the specified light pattern that indicates demand-related pricing for the period, and indicates relative size of the surcharge pool and the potential bonus stake. This light pattern triggering information is retained over the display period. At the end of the period, the old information is cleared and new display information is received and stored for the next display period.

In the case where individual B-S eligibility is desired, calendar-time watt hour meter 108, which keeps a running calendar-time record of energy consumption for given time intervals, replaces the standard watt hour meter. The calendar-time meter now incorporates B-S processor 109 and power-line carrier transmitter, PLCT 107, which feeds the digital byte information generated in B-S processor 109 through the consumer's powerline wiring where it is picked up by powerline carrier receiver 106a, which is incorporated in the display apparatus. Receiver 106a feeds its information into display processor 104 which converts the information into appropriate B-S eligibility light actuations only when the surcharge pool reaches a preset level.

B-S processor 109 normalizes the energy/second consumed during each time interval and compares that quantity with an assigned max energy level typical of consumed power during peak demand times by those consumers who are so equipped. The difference between typical assigned-max energy and that actually being consumed is further processed to create an eligibility byte which is periodically fed to display processor 104.

The preferred display is a single row of three red and three green points of light. Display processor 104 receives an address prefix which accesses the consumer's category. This is followed by a code which determines whether green or red is to be activated, and how many lights are to be flashed. A steady green indicates a below average price range and steady red indicating an above average range. No lights on would indicate that the average price is in effect. The number of green or red lights gives an indication of the extent to which the price is above or below the average rate.

When the utility indicates that B-S distribution is activated, the lights blink during its assigned time slot. For example, price lights might be on steadily for 5 seconds and then the lights blink at a 0.5 second rate during the following 5 seconds to indicate that B-S is being distributed. The number of red lights flashed indicates the relative size of the B-S pool. The number of simultaneously-on green blinking lights indicates the relative size of the bonus stake that is potentially available to the bonus eligible consumers.

Individual consumer B-S eligibility indicates whether that consumer is eligible for a bonus or surcharge during a high consumption time. This could be designated by a blinking green only for bonus eligibility or a blinking red only for surcharge eligibility. The duty cycle of the B-S blink is adjusted to indicate how far from the surcharge/bonus eligibility crossover point the consumer's current demand is. For example, a 0.25 duty cycle indicates close to crossover and an allocation of 25% of the bonus or surcharge is being effected, while a 0.75 duty cycle in the blink pattern would indicate 75% of the bonus or surcharge is in effect depending on whether the green or red is flashing.

FIGS. 2a-2g illustrate hardwire logic circuit embodiments of the invention that activate the display patterns that are triggered by bytes received from the broadcast radio and powerline carrier signals. Although the embodiments are illustrated in terms of hardwire-logic their functions can also be duplicated by programable microprocessers.

Figure 2A:
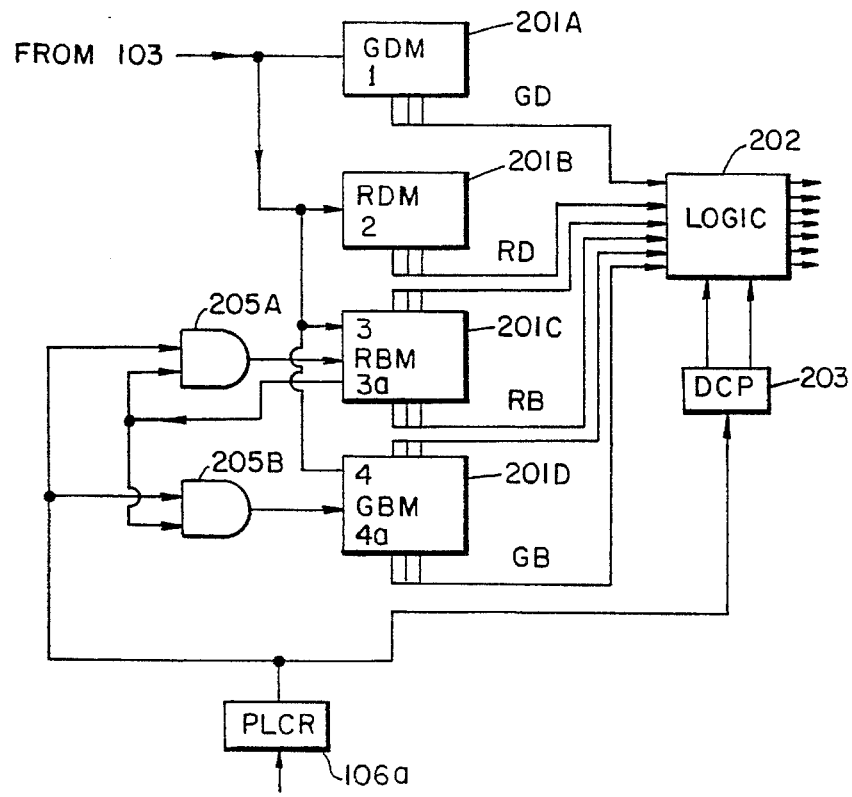
FIG. 2a illustrates a preferred display processer in block diagram form.

FIG. 2a shows specifics of display processor 104. The processor is comprised of four memory flip flop arrays, designated by 201a, 201b, 201c and 201d. Memory, 201a, activates one or more of the three green lights used to indicate below average demand pricing. This memory array, shown in more detail by FIG. 2c, is comprised of green address code receiver 220, gate 221, and three flip flop memory element 222, with each flip flop's output hardwired to a specific green light. The second array, 201b, is similar to 201a but responds only to a red address code and has each of its flip flops wired to specific red lights. The third and fourth memory arrays, 201c and 201d, are dual versions of 201a with one input connected to the broadcast receiver bus and the second input connected to the powerline carrier receiver bus through gates 205a and 205b. These gates are opened when memory 201c indicates three red lights are on. Separate address codes are assigned to each memory line.

A total of 18 buslines from the four memory arrays feed six logic circuits, illustrated by FIG. 2b. Each logic circuit develops the appropriate blink pattern for its assigned light. Logic circuit 202 receives blink control information from duty cycle processor 203. Display processer 104 can be used with or without information provided from the local powerline carrier receiver.

Each memory array has an address code receiver, ACR, associated with it. The address code for 201a is here referred to as 1, the code for 201b is 2, the code for 201c is 3 and 3a and the code for 201d is 4 and 4a. Address codes 1, 2, 3 and 4 are received from the broadcast transmitter with code 1 indicating that the information to follow determines the number of steady green lights to be actuated, Code 2 the pattern of steady red lights and Code 3 and 4 the pattern of blinking green and red lights that are simultaneously actuated. Codes 3 and 4 also open gates 205a and 205b which allow address codes 3a and 4a, received from the powerline carrier, to register their green or red light blink duty cycle. The duty cycle of the blinking lights is controlled by the processor shown by FIG. 2d. Here the specified duty cycle of the blink, which originates in B/S processor 109, is determined by the number of pulses that follow address code 5. This informational byte feeds duty cycle processer, DCP, 203. DCP 203 feeds out either a 50% duty cycle pulse stream, that determines the blink rate for the surcharge-pool/bonus-stake sequence, or the duty cycle used in the eligibility display sequence.

FIG. 2b describes one of six identical logic circuits found in logic array 202. Each logic circuit contains five-second-clock-busline which periodically opens gate 211a, and, through inverter 210, alternately opens gate 211c. Gate 211c is driven by the output from gate 211b which is in turn driven by the output from flip flop divider 212 whose outputs alternately opens gates 213 and 214, determining the time allotted for the B/S display as well as the duty cycle of the blink for the eligibility display. These are fed to gates 213 and 214 on bus line 1 and 2 from duty cycle processor 203. The output from gate 214 actuates gate 211d allowing the state of flip flop 1 associated with Code 3a line in 201c to be transferred to red light 105a. The outputs from gates 211a, 211c and 211d are joined to activate red light 105a. This configuration is replicated for each of the six lights. The end result of logic circuit 202 is to time share the price and B-S display functions using the same six lights.

FIG. 2c shows the signal received from radio receiver 103 actuating address code receiver 220 upon receipt of the correct code which in turn briefly opens gate 221 allowing the subsequent byte to register in three-stage flip-flop counter 222. Typically either 1, 3 or 7 pulses are fed into flip flop counter 222 during the open duration depending on how many lights are to be held on. Each busline out of the flip flop array connects to one of the three red or three green lights through logic circuit 202. A second code clears the counter prior its being updated.

FIG. 2d describes duty cycle processer 203. It receives signals from PLC receiver 106a which activates address code receiver 225 when code 5 is present. This code is followed by either 1, 2, or 4 pulses which feed flip flop counter 226 retaining the count which determines the blink duty cycle for the entire display duration. Counter 226 holds open gates 228a, 228b or 228c which feed the output from either multivibrator 227a, 227b, or 227c onto line 2. Multivibrator, MV 227a, produces a 25% duty pulse train, while MV 227b produces a 50% duty cycle square wave, and MV 227c produces a 75% duty cycle signal. The 50% duty cycle signal is also fed directly to busline 1.

Figure 2E:
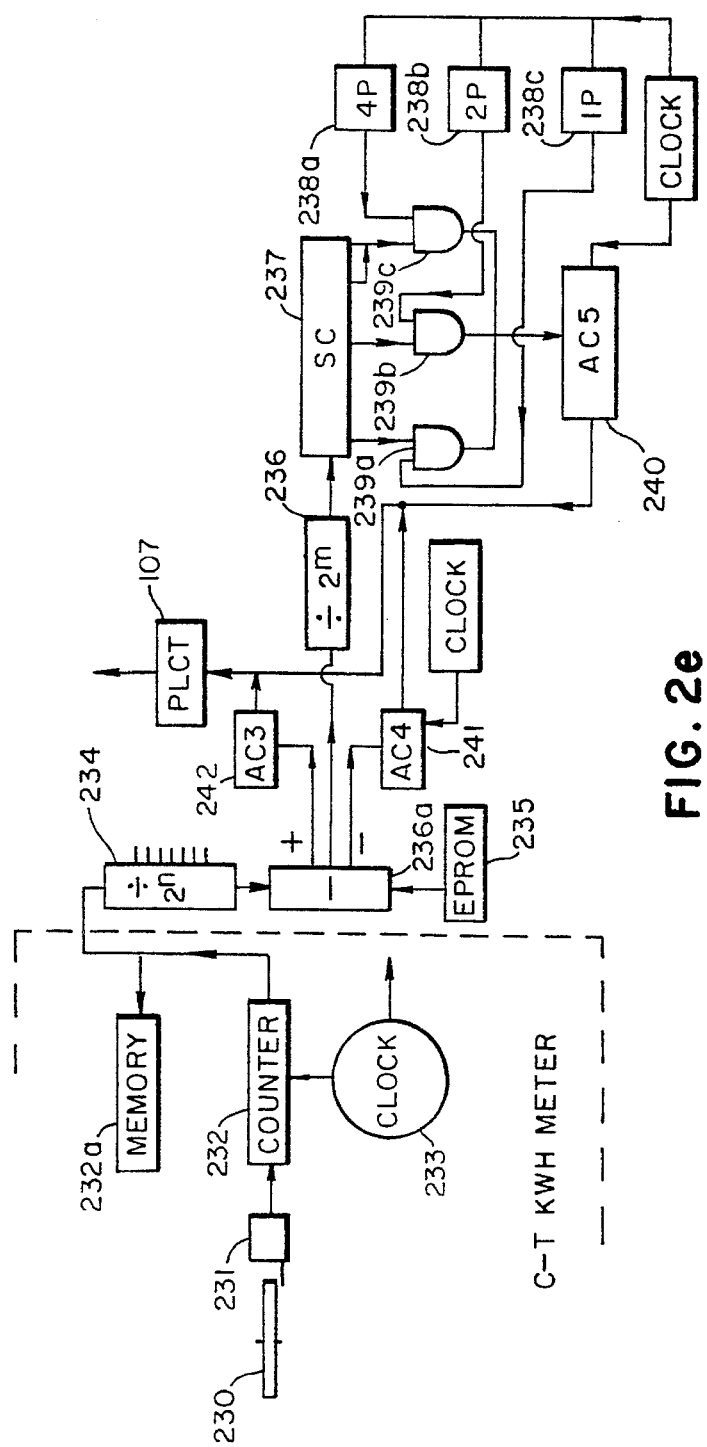
FIG. 2e illustrates, in block diagram form, the duty cycle processer for indicating individual consumer B-S eligibility.

FIG. 2e illustrates a method for ascertaining whether the individual consumer is eligible for a bonus or a surcharge and by what amount that eligibility exceeds a crossover quantity. The consumer is assumed to have a calendar-time, CT, KWH meter which is here consists of rotating disc 230 with means for counting number of rotations represented by sensor 231, counter 232 and clock 233. Clock 233 determines the count duration period. Counter 232 is read out and cleared at the end of the count period. That readout count is stored in memory 233a which is fed into $2^n$ divider 234 whose output is fed into subtraction register 236a which takes the difference between it and a assigned-max count assigned to the customer and stored in EPROM 235. If the result of the subtraction is positive, address code transmitter, ACT, 242 reads out its Code 3a. If the difference is negative, ACT 241 reads out its Code 4a. These code readouts are fed into powerline carrier transmitter, PLCT 107 and follow Code 5 which is generated in ACT 240.

The difference quantity determined in subtractor 236a is fed into a second flip flop array, 236, whose number of stages is selected by a jumperwire, the jumper's connection being dependent on the assigned-max quantity assigned to the consumer. The output from 236 is then fed into n-step counter 237. Depending on the count registered, either gate 239a, 239b, or 239c is opened, releasing 1 or 2 or 4 pulses from either pulse generator 238a, 238b or 238c, triggered once for each CT period by CT clock 233. The number of pulses determines the duty cycle of the eligibility blink. The count retained by step counter 237 could reach a progression that exceeds 3 steps so the counter has the steps beyond 3 tied together and connected to gate 239c. Thus any count beyond 3 keeps the highest duty cycle activated. Whether the green or red is activated is determined by the sign of the difference read out of subtractor 236a which is routed to either memories 201c or 201d by its address code. The eligibility display is activated when gates 205a and 205b are opened by the presence of a predetermined number of surcharge lights indicated by memory 201c.

The assigned-max quantity derived from EPROM 235 may be seasonal in nature requiring a winter and summer number. This would require two EPROMs and a means for selecting which one is current. This can be realized by a seasonal indicating signal derived from clock 233.

In many cases the eligibilty display may not be implemented. In such cases the enabling signal does not appear at PLCR 106a output and the time period allotted to the eligibility display is blanked out.

Figure 2F:
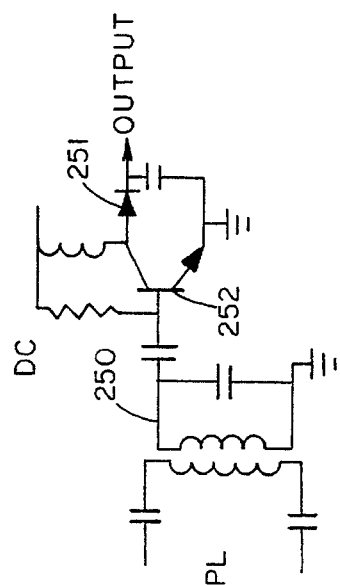
FIG. 2f is an illustrative power line carrier receiver.

FIG. 2f illustrates a simple powerline carrier receiver. It consists of balanced-to-unbalanced resonant circuit 250, feeding adjustable gain RF amplifier 251 whose output is detected by diode 252. FIG. 2g illustrates a powerline carrier transmitter which is comprised of balanced-to-unbalanced resonant circuit 250a fed by oscillator 253 which is turned on and off by the pulsed signal fed to it.

Drawing Title Label Key

|  | Existing Title | | Amended Title |
|---|---|---|---|
| FIG. 1 | 106a | PLCR | PLC Rec'v'r |
|  | 107 | PLCT | PLC XMTR |
| FIG. 2a | 106a | PLCR | PLC Rec'v'r |
|  | 201A | GDM | Green Price Mem. |
|  | 201B | RDM | Red Price Mem. |
|  | 201C | RBM | Red B-S Mem. |
|  | 203 | DCP | Duty Cycle Proc'r. |
| FIG. 2b |  | RD1 | Red Price$_1$ |
|  |  | RB1 | Red B-S$_1$ |
| FIG. 2c | 220 | ACR | Address Rec. |
|  | 222 | 3 FF | Triple Flip Flop |
| FIG. 2d | 225 | ACR5 | Address Rec. 5 |
|  | 226 | FF | 3 Flip Flops |
| FIG. 2e | 235 | ... | EPROM |
|  | 107 | PLCT | PLC XMTR |
|  | 237 | SC | Step CTR |
|  | 237a | 4P | 4 Pulse Gen. |
|  | 238b | 2P | 2 Pulse Gen. |
|  | 238c | 1P | 1 Pulse Gen. |
|  | 240 | AC5 | Address XMT-5 |
|  | 241 | AC4 | Address XMT-4 |
|  | 242 | AC3 | Address XMT-3 |

I claim:

1. A near real-time method for helping typical consumers of price fluctuating electricity quickly prioritize their use of electricity for better cost management of their electric power consumption, is comprised of the steps of;

estimating, by a utility, an upcoming time slot's price deviation from a pre-established mean price of the electricity;

assigning said deviation into a quantitative, ie. high, medium or low, and positive or negative, category;

estimating, during high demand periods, the gross size of any surcharge pool and bonus stake/KWH that will be distributed to consumers;

assigning said gross surcharge pool and bonus stake into quantitative categories:

periodically transmitting said category information from a utility center to consumers;

storing said category information in each consumer's display processor;

optionally receiving data from a calendar-time watt-hour meter located on consumer's premises and processing said data to indicate a consumer's eligiblity for surcharge or bonus distributions and the extent of that eligibility; and displaying all said information to the consumer with red and green lights, green indicating economically advantageous times to use power and red indicating more expensive power, with the number of lights lit and/or their blink duty cycle further quantifying the consumption economics.

2. Display apparatus that helps consumers quickly prioritize their consumption of commoditized electricity as its price fluctuates and when bonus-surcharge distributions are in-effect, is comprised of;

red and green lights mounted on a surface that can be casually viewed, such as on a clock face;

means for receiving data that is periodically transmitted from a utility control center, and optionally from a calendar-time watt-hour meter located on the consumer's premises;

a means for storing said received information and effecting a continuous display over a given time interval; and a processer that converts said stored information into light sequences that instinctively guide the typical consumer to efficient management of electric power consumption.

3. Apparatus for indicating individual consumer bonus-surcharge eligibility and extent of that eligibility, is comprised of;

a first processor, co-located with consumer's calendar-time watt-hour meter, which generates differences between the calendar-time watt-hour meter readings taken over a given time interval and that consumer's assigned maximum consumption during high system demand times, with the sign of the difference indicating eligibility for a bonus or a surcharge; and a second processor, co-located at each display site, connected to said first processor by powerline carrier and to utility by radio, with said second processor determining blinking display light color, to indicate bonus or surcharge eligibility, with said color being determined from the sign of said difference, and also determining a blink duty cycle from the magnitude of said difference to indicate extent of eligibility.

4. A method for simultaneously indicating relative price and bonus-surcharge status using a single set of display lights to provide guidance for the management of electric power consumption by typical consumers, is comprised of the steps of;

activating, for a prescribed first time duration, either green lights to indicate below average price conditions or red lights to indicate above average price conditions with the number of red or green lights lit quantifying the extent of the above or below average price;

activating, during alternating time periods, simultaneously lights blinking green and red lights, with the number of red lights indicating the estimated size of any surcharge pool, and the number of blinking green lights indicating the estimated bonus stake/KWH that is available;

activating an optional third time-shared display using blinking green lights to indicate individual consumer's bonus eligibility or blinking red to indicate surcharge eligibility, and the individual consumer's extent of eligibility being indicated by the duty cycle of the blink, ie. a 25% duty cycle indicating consumer's demand is near a crossover between bonus and surcharge eligibility; and assigning a time duration to the cycling, time-shared display sequences that is long enough for a consumer to easily resolve each parameter yet short enough so that a single glance will, with experience, provide an overview of power consumption economics in order to better prioritize its use.

* * * * *